United States Patent
Penney et al.

(10) Patent No.: US 10,068,664 B1
(45) Date of Patent: Sep. 4, 2018

(54) COLUMN REPAIR IN MEMORY

(71) Applicant: Micron Technology, Inc., Boise, ID (US)

(72) Inventors: Daniel B. Penney, Wylie, TX (US); Guy S. Perry, Plano, TX (US); Harish N. Venkata, Allen, TX (US); Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/600,409

(22) Filed: May 19, 2017

(51) Int. Cl.
*G11C 29/00* (2006.01)

(52) U.S. Cl.
CPC .......... *G11C 29/886* (2013.01); *G11C 29/702* (2013.01); *G11C 29/74* (2013.01); *G11C 29/785* (2013.01); *G11C 29/838* (2013.01); *G11C 29/86* (2013.01)

(58) Field of Classification Search
CPC ..... G11C 29/886; G11C 29/702; G11C 29/74; G11C 29/785; G11C 29/838; G11C 29/86
See application file for complete search history.

(56) References Cited

U.S. PATENT DOCUMENTS

| | | | |
|---|---|---|---|
| 4,380,046 A | 4/1983 | Fung | |
| 4,435,792 A | 3/1984 | Bechtolsheim | |
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

(Continued)

*Primary Examiner* — Pho M Luu
(74) *Attorney, Agent, or Firm* — Brooks, Cameron & Huebsch, PLLC

(57) ABSTRACT

Apparatuses and methods related to column repair in memory are described. An apparatus can include sensing circuitry. The sensing circuitry can include a first sensing component, a second sensing component, and a third sensing component. The second sensing component can include a defective sense amplifier that is column repaired. The apparatus can include a controller configured to use the sensing circuitry to shift data from the first sensing component to the third sensing component by transferring the data through the second sensing component. The second sensing component can be physically located between the first sensing component and the third sensing component.

25 Claims, 8 Drawing Sheets

(56) References Cited

U.S. PATENT DOCUMENTS

| | | | |
|---|---|---|---|
| 5,253,308 A | 10/1993 | Johnson | |
| 5,276,643 A | 1/1994 | Hoffmann et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,418,498 B1 | 7/2002 | Martwick | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Seo | |
| 8,238,173 B2 | 8/2012 | Akerib et al. | |
| 8,274,841 B2 | 9/2012 | Shimano et al. | |
| 8,279,683 B2 | 10/2012 | Klein | |
| 8,310,884 B2 | 11/2012 | Iwai et al. | |
| 8,332,367 B2 | 12/2012 | Bhattacherjee et al. | |
| 8,339,824 B2 | 12/2012 | Cooke | |
| 8,339,883 B2 | 12/2012 | Yu et al. | |
| 8,347,154 B2 | 1/2013 | Bahali et al. | |
| 8,351,292 B2 | 1/2013 | Matano | |
| 8,356,144 B2 | 1/2013 | Hessel et al. | |
| 8,417,921 B2 | 4/2013 | Gonion et al. | |
| 8,462,532 B1 | 6/2013 | Argyres | |
| 8,484,276 B2 | 7/2013 | Carlson et al. | |
| 8,495,438 B2 | 7/2013 | Roine | |
| 8,503,250 B2 | 8/2013 | Demone | |
| 8,526,239 B2 | 9/2013 | Kim | |
| 8,533,245 B1 | 9/2013 | Cheung | |
| 8,555,037 B2 | 10/2013 | Gonion | |
| 8,599,613 B2 | 12/2013 | Abiko et al. | |
| 8,605,015 B2 | 12/2013 | Guttag et al. | |
| 8,625,376 B2 | 1/2014 | Jung et al. | |
| 8,644,101 B2 | 2/2014 | Jun et al. | |
| 8,650,232 B2 | 2/2014 | Stortz et al. | |
| 8,873,272 B2 | 10/2014 | Lee | |
| 8,964,496 B2 | 2/2015 | Manning | |
| 8,971,124 B1 | 3/2015 | Manning | |
| 9,015,390 B2 | 4/2015 | Klein | |
| 9,047,193 B2 | 6/2015 | Lin et al. | |
| 9,165,023 B2 | 10/2015 | Moskovich et al. | |
| 9,659,610 B1 * | 5/2017 | Hush | G11C 19/28 |
| 9,761,300 B1 * | 9/2017 | Willcock | G11C 11/4091 |
| 9,779,784 B2 * | 10/2017 | Hush | G11C 7/065 |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0028584 A1 | 10/2001 | Nakayama et al. | |

(56) References Cited

U.S. PATENT DOCUMENTS

| | | |
|---|---|---|
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0365129 A1 | 12/2016 | Willcock |
| 2016/0371033 A1 | 12/2016 | La Fratta et al. |
| 2017/0052906 A1 | 2/2017 | Lea |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |

(56) References Cited

FOREIGN PATENT DOCUMENTS

| WO | 2013062596 | 5/2013 |
|---|---|---|
| WO | 2013081588 | 6/2013 |
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing In-Memory Technology for Knowledge Discovery Algorithms,"Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory As a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

\* cited by examiner

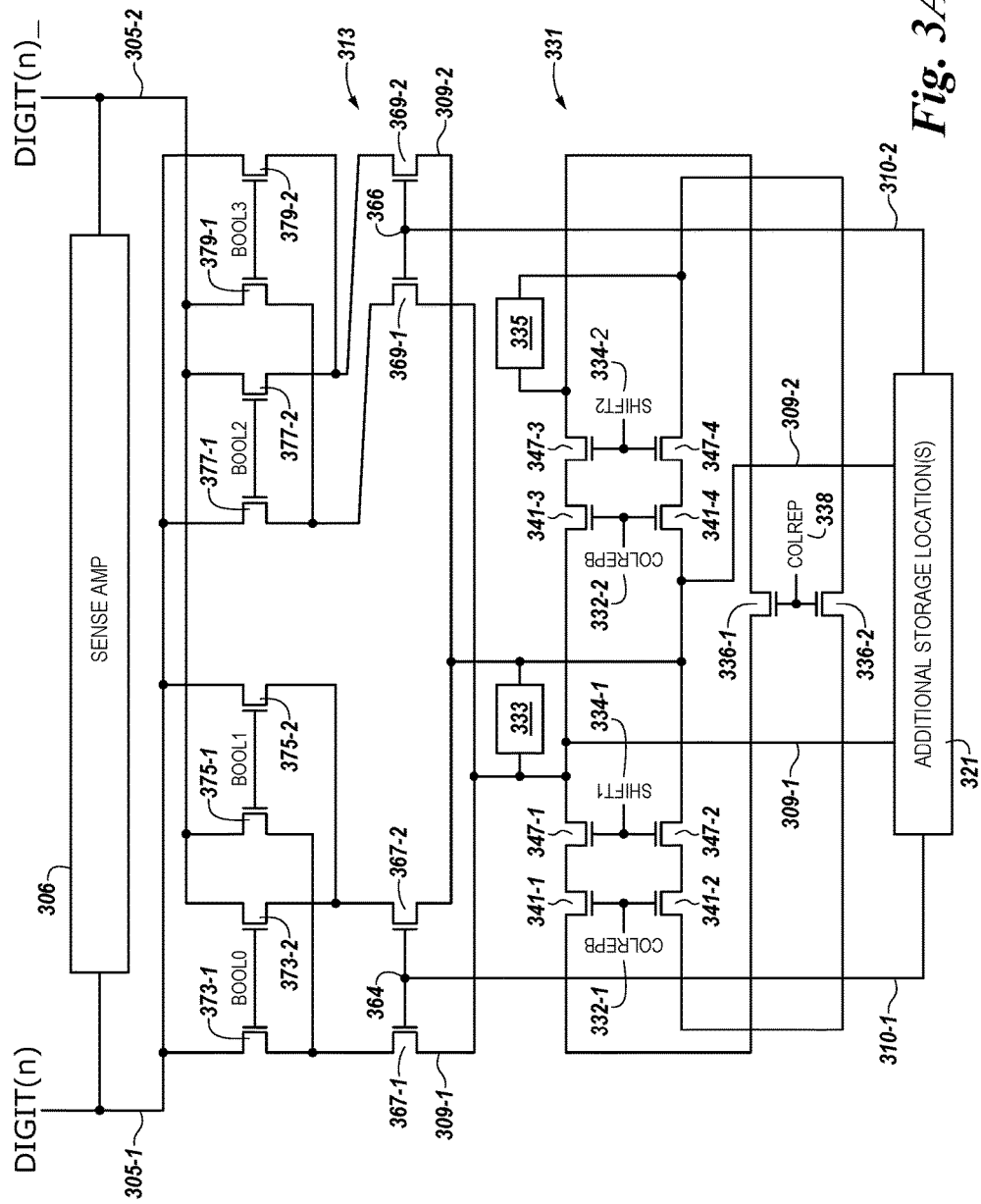

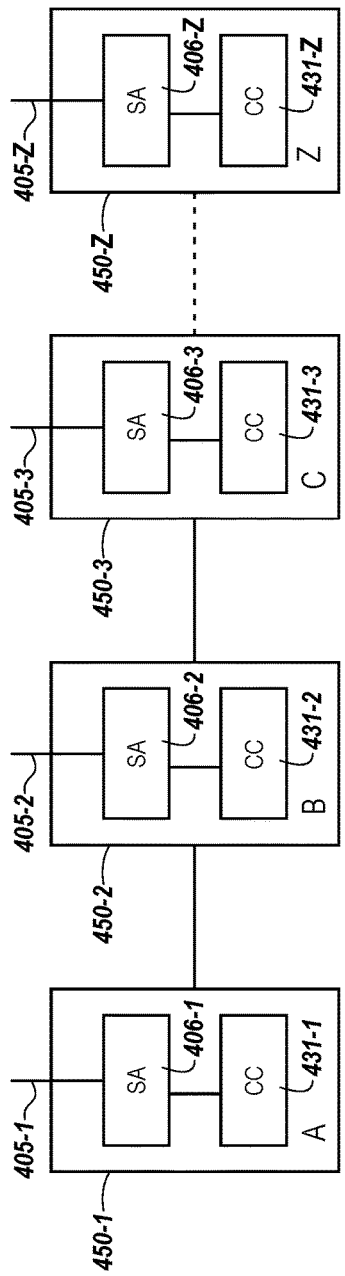
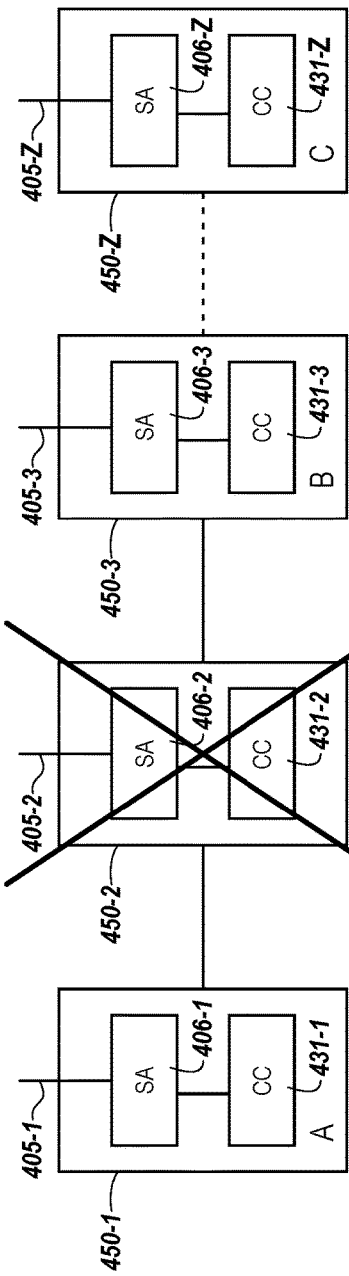
Fig. 4A
Fig. 4B

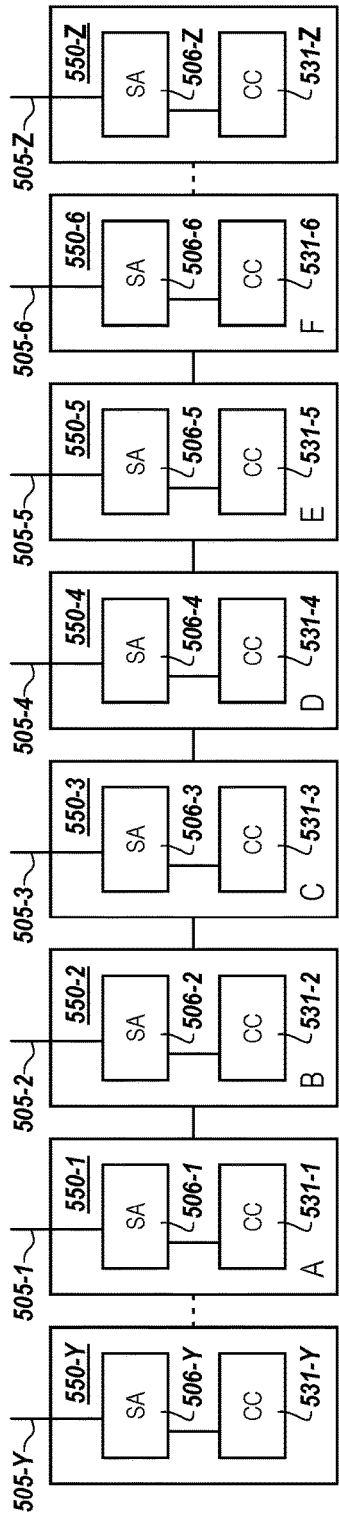
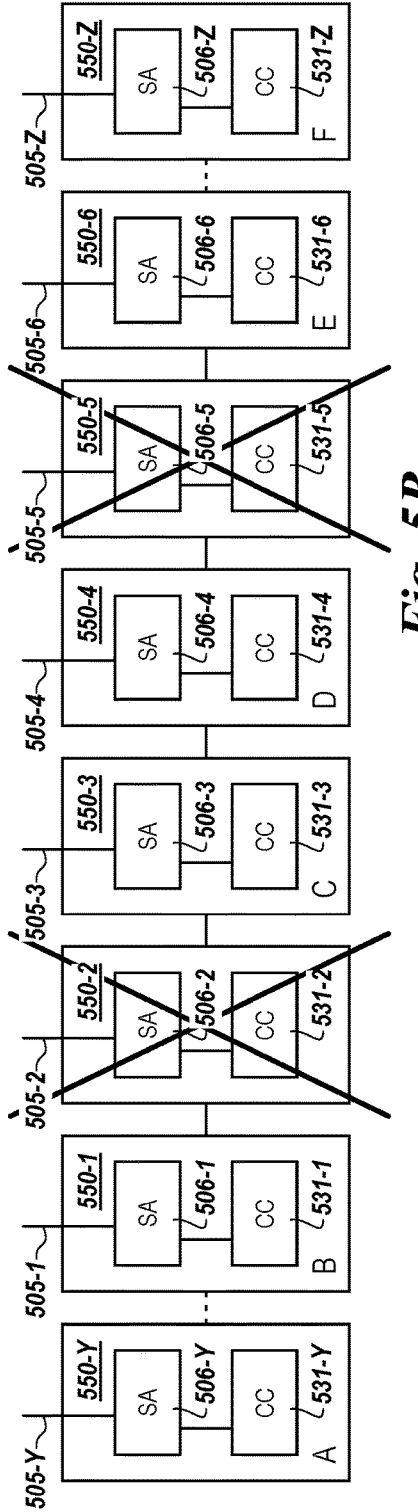
*Fig. 5A*
*Fig. 5B*

RESULT IN FIRST STORAGE LOCATION -- (AFTER SENSE AMP FIRE)

BOOL3, BOOL2, BOOL1, BOOL0

| A | B | 0000 | 0001 | 0010 | 0101 | 0100 | 0110 | 1000 | 1001 | 1010 |
|---|---|------|------|------|------|------|------|------|------|------|
|   |   | A | A*B | A*$\bar{B}$ | B | A+B | AXB | A+$\bar{B}$ | $\overline{AXB}$ | $\bar{B}$ |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 0 | 1 | 1 | 1 | 0 | 1 |
| 1 | 1 | 1 | 1 | 0 | 1 | 1 | 0 | 1 | 1 | 0 |

*Fig. 7A*

RESULT IN SENSE AMP -- (BEFORE SENSE AMP FIRE)

BOOL3, BOOL2, BOOL1, BOOL0

| A | B | 0000 | 0001 | 0010 | 0101 | 0100 | 0110 | 1000 | 1001 | 1010 |
|---|---|------|------|------|------|------|------|------|------|------|
|   |   | B | A+B | $\bar{A}$*B | A | A*B | RESET | $\bar{A}$+B | SET | $\bar{A}$ |
| 0 | 0 | 0 | 0 | 0 | 0 | 0 | 0 | 1 | 1 | 1 |
| 0 | 1 | 1 | 1 | 1 | 0 | 0 | 0 | 1 | 1 | 1 |
| 1 | 0 | 0 | 1 | 0 | 1 | 0 | 0 | 0 | 1 | 0 |
| 1 | 1 | 1 | 1 | 0 | 1 | 1 | 0 | 1 | 1 | 0 |

COLUMN REPAIR IN MEMORY

TECHNICAL FIELD

The present disclosure relates generally to semiconductor memory and methods, and more particularly, to apparatuses and methods related to column repair in memory.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processing-in-memory (PIM) device, in which a processing resource may be implemented internal and/or near to a memory (e.g., directly on a same chip as the memory array). A PIM device may reduce time in processing and may also conserve power. Data movement between and within arrays and/or subarrays of various memory devices, such as PIM devices, can affect processing time and/or power consumption.

BRIEF DESCRIPTION OF THE DRAWINGS

FIGS. 3A-3B are a schematic diagrams illustrating a portion of a memory array including compute component 331 comprising selection logic circuitry 313 and additional storage location(s) 321 in accordance with a number of embodiments of the present disclosure.

FIGS. 4A-4B are each a schematic diagram illustrating a portion of a memory array including sensing components in accordance with a number of embodiments of the present disclosure.

FIGS. 5A-5B are each a schematic diagram illustrating a portion of a memory array including sensing components in accordance with a number of embodiments of the present disclosure.

FIG. 7A is a logic table illustrating selectable logical operation results implemented by sensing circuitry in accordance with a number of embodiments of the present disclosure.

FIG. 7B is another logic table illustrating selectable logical operation results implemented by sensing circuitry in accordance with a number of embodiments of the present disclosure.

DETAILED DESCRIPTION

Figure 1:
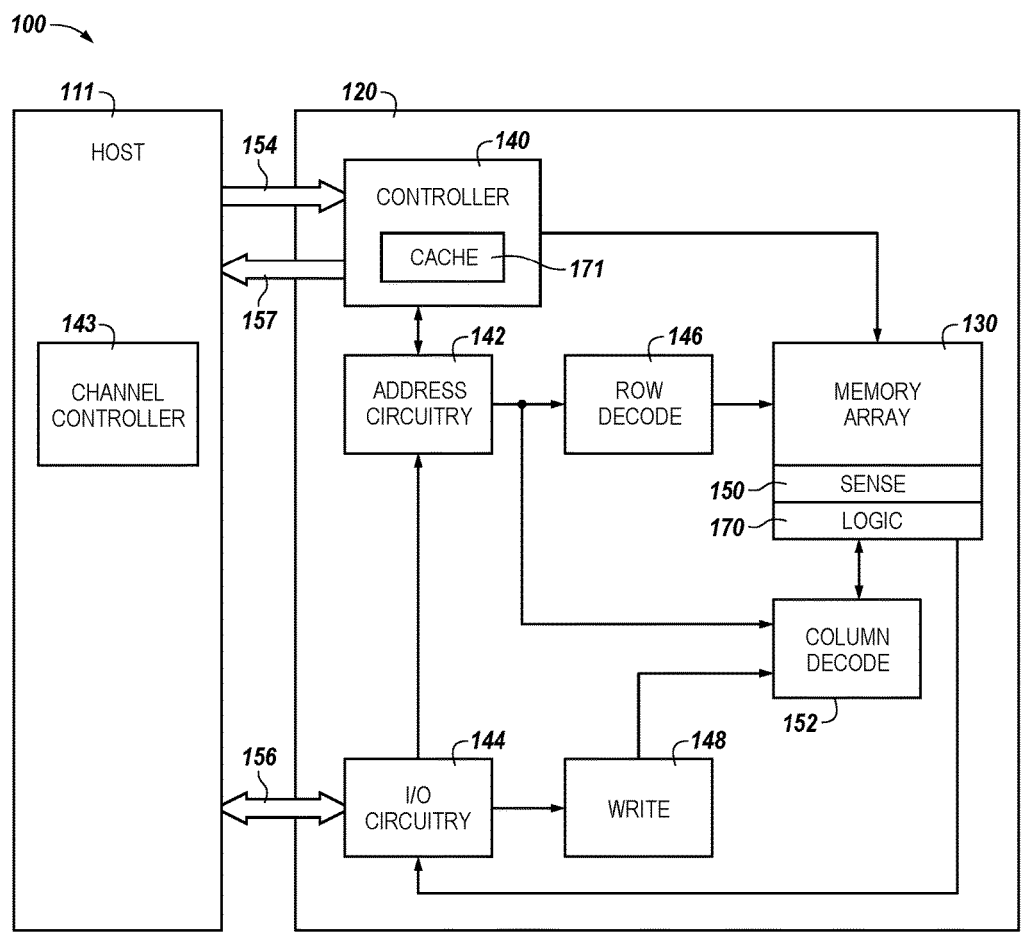
FIG. 1 is a block diagram of an apparatus in the form of a computing system including a memory device in accordance with a number of embodiments of the present disclosure.

The present disclosure includes apparatuses and methods related to column repair in memory. An example apparatus can include sensing circuitry. The sensing circuitry can include a first sensing component, a second sensing component, and a third sensing component. The second sensing component can include a defective sense amplifier that is column repaired. The apparatus can include a controller configured to use the sensing circuitry to shift data from the first sensing component to the third sensing component by transferring the data through the second sensing component. The second sensing component can be physically located between the first sensing component and the third sensing component.

In some embodiments, sensing circuitry may include one or more storage locations associated therewith. In a number of embodiments, compute component circuitry may include a number of storage locations (e.g., compute component storage locations) associated therewith. For example, compute component circuitry may include a number of latches configured to store an operand (e.g., a data value which may serve as an input to a logical operation). As described further herein, the sensing circuitry can be formed on pitch with sense lines (e.g., digit lines) of an array.

In a number of embodiments, sensing circuitry coupled to respective columns of an array can be referred to as sensing components (e.g., with each sensing component comprising a sense amplifier and corresponding compute component).

The sensing components can be controlled to perform various operations (e.g., logical operations) on a per column basis. For instance, in a number of embodiments, the sensing components corresponding to respective columns (e.g., pairs of complementary digit lines) can serve as respective processing resources (e.g., 1-bit processing elements). The sensing components can be controlled to shift data from one column (e.g., sensing component) to another column (e.g., neighboring or subsequent sensing component).

When a sense amplifier becomes defective and a fuse associated with the defective sense amplifier is blown, shifting data out of the sense amplifier can be prevented. In addition, the blown fuse can, in some previous approaches, prevent the data from a neighboring sense amplifier from shifting from that neighboring sense amplifier to a sense amplifier on the other side of the defective sense amplifier. In some previous approaches, DRAM column repair can include fuses corresponding to defectives sense amplifiers being blown. Fuse mapping can then be used to replace the defective sense amplifier with a replacement (e.g., redundant) sense amplifier (e.g., via column repair circuitry). For example, column repair circuitry can associate the replacement sense amplifier with the defective sense amplifier and use mapping to keep track of the location of the defective sense amplifier. However, such fuse mapping may not be adequate for instances in which maintaining serial bit-shifting functionality is useful (e.g., in association with performing operations such as add, subtract, etc.). For example, using a replacement sense amplifier by directly associating that replacement sense amplifier with the defective sense amplifier can add additional calculations when shifting data on a column-by-column basis. By moving data of the row of sensing components associated with a redundant sense amplifier instead of solely the data from the defective sense amplifier, processing time and efficiency can be improved.

Some approaches to performing logical operations in a memory device can include performing multiple row cycles to perform logical operations. For example, in some approaches, multiple row cycles may be used to perform operations (e.g., Boolean logical operations) by using a redundant sense amplifier instead of a defective sense amplifier to transfer data between columns of a memory device.

In some embodiments, a sensing component may be connected to another sensing component such that data values (e.g., bits) may be moved (e.g., shifted) from one sensing component to another sensing component. Shifting data values between one sensing component and another sensing component may be done synchronously such that a first sensing component receives a data value from a second sensing component as the second sensing component passes its data value to a third sensing component. In some embodiments, shifting data between sensing components can facilitate various processing functions such as the multiplication, addition, etc. of two data values (e.g., operands).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "n" or "x", particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 150 may reference element "50" in FIG. 1, and a similar element may be referenced as 250 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, controller 140, channel controller 143, memory array 130, and/or sensing circuitry 150, for example, might also be separately considered an "apparatus."

System 100 includes a host 111 coupled (e.g., connected) to memory device 120, which includes a memory array 130. Host 111 can be a host system such as a personal laptop computer, a desktop computer, a digital camera, a smart phone, or a memory card reader, among various other types of hosts. Host 111 can include a system motherboard and/or backplane and can include a number of processing resources (e.g., one or more processors, microprocessors, or some other type of controlling circuitry). The system 100 can include separate integrated circuits or both the host 111 and the memory device 120 can be part of a same integrated circuit (e.g., on a same chip). The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines or select lines, and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals for data provided over a bus 156 (e.g., a data/address bus) through I/O circuitry 144. Status and/or exception information can be provided from the controller 140 on the memory device 120 to a channel controller 143, through a high speed interface (HSI) including an out-ofband bus 157, which in turn can be provided from the channel controller 143 to the host 111. Address signals are received through address circuitry 142 and decoded by a row decoder 146 and a column decoder 152 to access the memory array 130. Data can be read from memory array 130 by sensing voltage and/or current changes on the digit lines using sensing circuitry 150. The sensing circuitry 150 can read and latch a page (e.g., row) of data from the memory array 130. The I/O circuitry 144 can be used for bi-directional data communication with host 111 over the bus 156. The write circuitry 148 can be used to write data to the memory array 130.

Controller 140 (e.g., memory controller) decodes signals provided by control bus 154 from the host 111. These signals can include chip enable signals, write enable signals, and address latch signals that are used to control operations performed on the memory array 130, including data read, data write, and data erase operations. In various embodiments, the controller 140 is responsible for executing instructions from the host 111 and sequencing access to the array 130. The controller 140 can be a state machine, sequencer, or some other type of controller and include hardware and/or firmware (e.g., microcode instructions) in the form of an application specific integrated circuit (ASIC). In some embodiments, the controller 140 may include cache 171. The controller 140 can control, for example, sensing circuitry in accordance with embodiments described herein. For example, the controller 140 can control generation of clock signals and application of the clock signals to compute components in association with performing logical operations and/or data shifting operations.

As described further below, in a number of embodiments, the sensing circuitry 150 can comprise a plurality of sensing components, which can each include a sense amplifier and a compute component. The compute component may also be referred to herein as an accumulator, and can be used to perform logical operations (e.g., on data associated with complementary digit lines). According to various embodiments, the compute component can comprise a number of storage locations (e.g., latches) that can serve as stages of a shift register, for example. In a number of embodiments, the sensing circuitry 150 can be used to perform logical operations using data stored in array 130 as inputs and/or store the results of the logical operations back to the array 130 without transferring data via a digit line address access (e.g., without firing a column decode signal). For instance, various operations (e.g., compute functions) can be performed using, and within, sensing circuitry 150 rather than (or in association with) being performed by processing resources external to the sensing circuitry (e.g., by a processing resource associated with host 111 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. An example configuration of the sensing circuitry 150 being formed on pitch is illustrated in FIG. 7. Additional logic circuitry 170 can be coupled to the sensing circuitry 150 and can be used to store (e.g., cache and/or buffer) results of operations described herein.

In a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 111). For instance, host 111 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., 150) without enabling column decode lines of the array. Whether or not local I/O lines are used in association with performing logical operations via sensing circuitry 150, the local I/O line(s) may be enabled in order to transfer a result to a suitable location other than back to the array 130 (e.g., to an external register).

Figure 2:
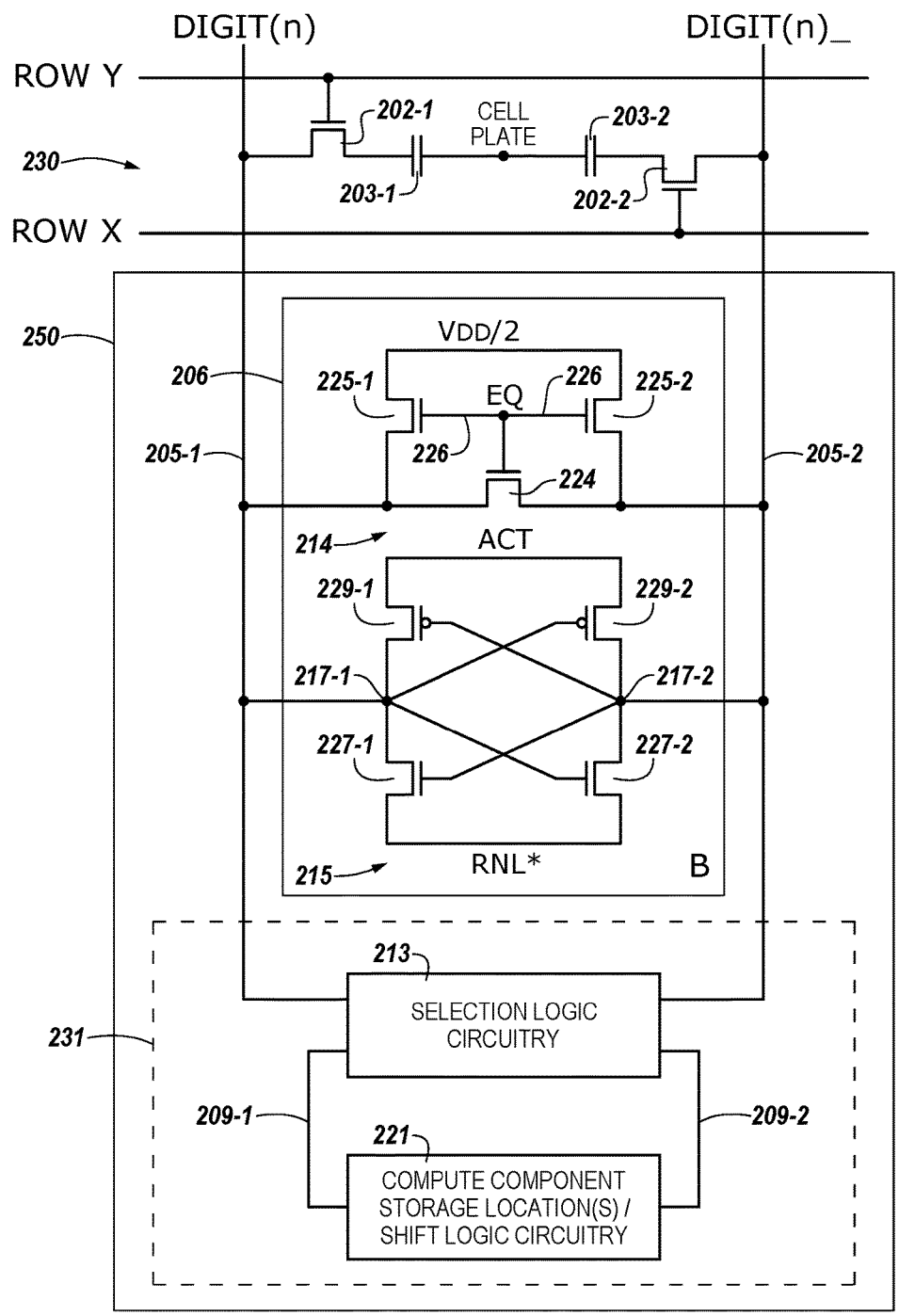
FIG. 2 is a schematic diagram of a portion of a memory array including sensing circuitry in accordance with a number of embodiments of the present disclosure.

FIG. 2 is a schematic diagram illustrating a portion of a memory array 230 including sensing circuitry in accordance with a number of embodiments of the present disclosure. FIG. 2 illustrates one sensing component 250 which can be one of a number of sensing components corresponding to sensing circuitry 150 shown in FIG. 1. In the example shown in FIG. 2, the memory array 230 is a DRAM array of 1T1C (one transistor one capacitor) memory cells in which a transistor serves as the access device and a capacitor serves as the storage element; although other embodiments of configurations can be used (e.g., 2T2C with two transistors and two capacitors per memory cell). In this example, a first memory cell comprises transistor 202-1 and capacitor 203-1, and a second memory cell comprises transistor 202-2 and capacitor 203-2, etc.

The cells of the memory array 230 can be arranged in rows coupled by access lines 204-X (Row X), 204-Y (Row Y), etc., and columns coupled by pairs of complementary digit lines (e.g., digit lines 205-1 labelled DIGIT(n) and 205-2 labelled DIGIT(n)_ in FIG. 2). Although only one pair of complementary digit lines are shown in FIG. 2, embodiments of the present disclosure are not so limited, and an array of memory cells can include additional columns of memory cells and complementary digit lines (e.g., 4,096, 8,192, 16,384, etc.).

Memory cells can be coupled to different digit lines and word lines. For instance, in this example, a first source/drain region of transistor 202-1 is coupled to digit line 205-1, a second source/drain region of transistor 202-1 is coupled to capacitor 203-1, and a gate of transistor 202-1 is coupled to word line 204-Y. A first source/drain region of transistor 202-2 is coupled to digit line 205-2, a second source/drain region of transistor 202-2 is coupled to capacitor 203-2, and a gate of transistor 202-2 is coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The digit lines 205-1 and 205-2 of memory array 230 are coupled to sensing component 250 in accordance with a number of embodiments of the present disclosure. Sensing component, such as sensing component 250, can serve as respective 1-bit processing elements, for example, and can perform SIMD (single instruction multiple data) operations on a column by column basis, as described further below. In this example, the sensing component 250 comprises a sense amplifier 206 and a compute component 231 corresponding to a respective column of memory cells (e.g., coupled to a respective pair of complementary digit lines). The sense amplifier 206 is coupled to the pair of complementary digit lines 205-1 and 205-2. The sense amplifier 206 is coupled to the compute component 231. In this example, the compute component 231 includes selection logic circuitry 213 and compute component storage locations/shift logic circuitry 221, which are coupled via accumulator signal lines 209-1 and 209-2. As used herein, "selection logic" can include logical operation selection logic, for example, logic selectively operated to perform selected logical operations (e.g., Boolean logical operations). The selection logic circuitry 213 can be coupled to the pair of complementary digit lines 205-1 and 205-2 and configured to perform logical operations on data stored in array 230. In a number of embodiments, compute component 231 can be formed on pitch with the digit lines of the array. For example, the compute component 231 may conform to a same pitch as adjacent digit lines of the array 230 such that the compute component 231 and the sense amplifier 206 obey a particular sense line pitch constraint (e.g., 4F, 6F, etc., where "F" is a feature size).

The sense amplifier 206 can be operated to determine a data value (e.g., logic state) stored in a selected memory cell. The sense amplifier 206 can comprise a cross coupled latch 215 (e.g., gates of a pair of transistors, such as n-channel transistors 227-1 and 227-2 are cross coupled with the gates of another pair of transistors, such as p-channel transistors 229-1 and 229-2), which can be referred to herein as a primary latch. However, embodiments are not limited to this example.

In operation, when a memory cell is being sensed (e.g., read), the voltage on one of the digit lines 205-1 or 205-2 will be slightly greater than the voltage on the other one of digit lines 205-1 or 205-2. An ACT signal and an RNL* signal can be activated (e.g., ACT is driven high to a rail voltage such as VDD and RNL* is driven low to a rail voltage such as ground) to enable (e.g., fire) the sense amplifier 206. The digit line 205-1 or 205-2 having the lower voltage will turn on one of the transistors 229-1 or 229-2 to a greater extent than the other of transistors 229-1 or 229-2, thereby driving high the digit line 205-1 or 205-2 having the higher voltage to a greater extent than the other digit line 205-1 or 205-2 is driven high.

Similarly, the digit line 205-1 or 205-2 having the higher voltage will turn on one of the transistors 227-1 or 227-2 to a greater extent than the other of the transistors 227-1 or 227-2, thereby driving low the digit line 205-1 or 205-2 having the lower voltage to a greater extent than the other digit line 205-1 or 205-2 is driven low. As a result, after a short delay, the digit line 205-1 or 205-2 having the slightly greater voltage is driven to the voltage of the supply voltage $V_{DD}$ through a source transistor, and the other digit line 205-1 or 205-2 is driven to the voltage of the reference voltage (e.g., ground) through a sink transistor. Therefore, the cross coupled transistors 227-1 and 227-2 and transistors 229-1 and 229-2 serve as a sense amplifier pair, which amplify the differential voltage on the digit lines 205-1 and 205-2 and operate to store (e.g., latch) a data value sensed from the selected memory cell.

Embodiments are not limited to the sensing component configuration illustrated in FIG. 2. As an example, the sense amplifier 206 can be a current-mode sense amplifier and/or a single-ended sense amplifier (e.g., sense amplifier coupled to one digit line). Also, embodiments of the present disclosure are not limited to a folded digit line architecture such as that shown in FIG. 2.

In this example, the sense amplifier 206 includes equilibration circuitry 214, which can be configured to equilibrate the digit lines 205-1 and 205-2. The equilibration circuitry 214 comprises a transistor 224 coupled between digit lines 205-1 and 205-2. The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 is coupled to digit line 205-1, and a second source/drain region of transistor 225-2 is coupled to digit line 205-2. Gates of transistors 224, 225-1, and 225-2 can be coupled together and to an equilibration (EQ) control signal line 226. As such, activating EQ enables the transistors 224, 225-1, and 225-2, which effectively shorts digit lines 205-1 and 205-2 together and to the equilibration voltage (e.g., $V_{DD}/2$). Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

Figure 3B:
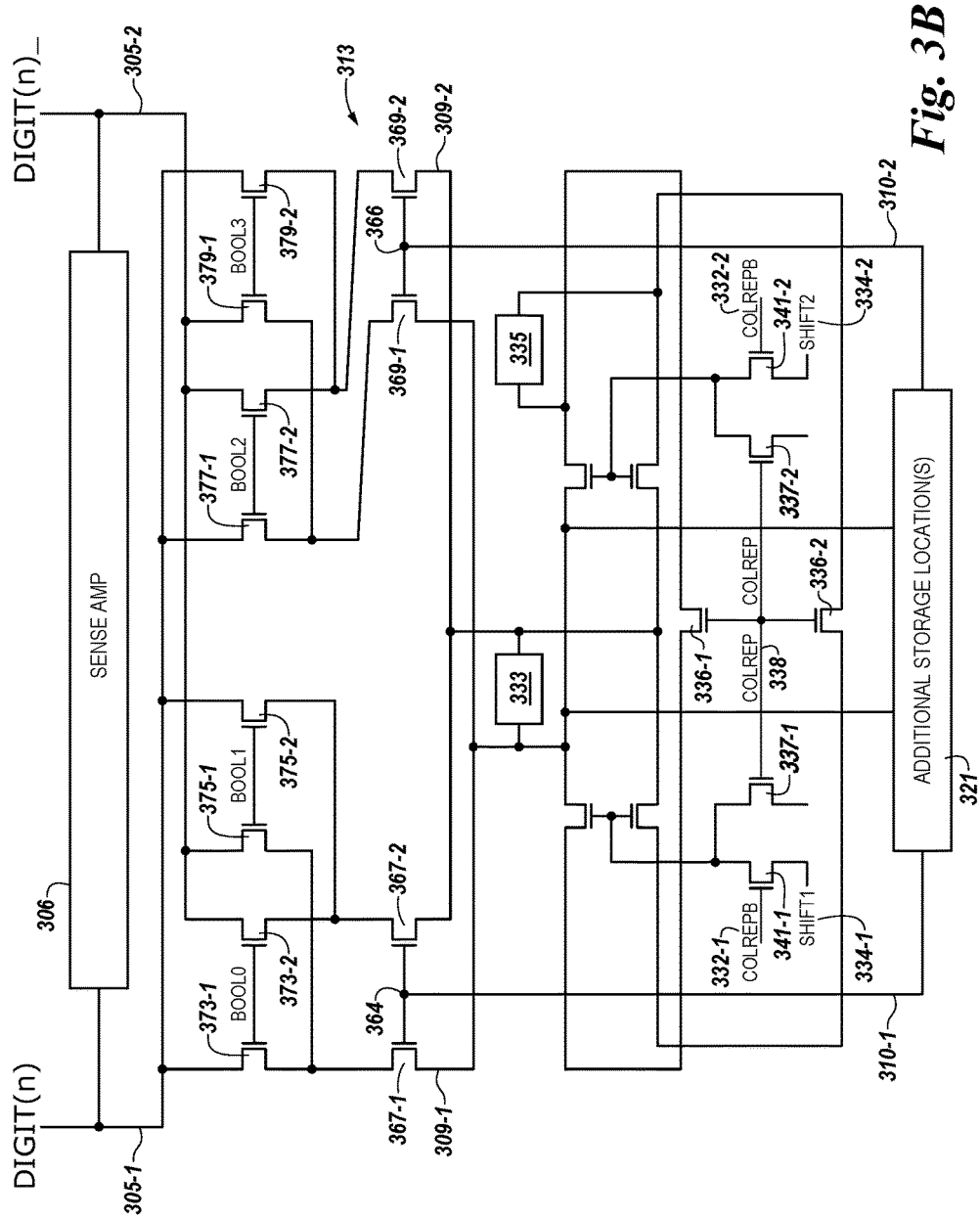

FIGS. 3A-3B are a schematic diagrams illustrating a portion of a memory array including compute component 331 comprising selection logic circuitry 313 and additional storage location(s) 321 in accordance with a number of embodiments of the present disclosure. Although not shown, memory cells, such as those described in FIG. 2, are coupled to pairs of complementary sense lines (e.g., digit lines 305-1 and 305-2). The selection logic circuitry 313 illustrated in FIG. 3A is an example of logic circuitry that can be used to perform operations in accordance with embodiments of the present disclosure. In this example, the selection logic circuitry 313 comprises four pairs of transistors 373-1/373-2, 375-1/375-2, 377-1/377-2, and 379-1/379-2 coupled to the pair of complementary digit lines 305-1 and 305-2 via their source/drain regions. The gates of the transistor pairs 373-1/373-2, 375-1/375-2, 377-1/377-2, and 379-1/379-2 are configured to receive respective selection logic signals BOOL0, BOOL1, BOOL2, and BOOL3. The selection logic signals can be selectively operated to perform logical operations using the sensing circuitry as described in more detail with respect to FIGS. 6A-6B.

In the example shown in FIG. 3A, a first source/drain region of transistor 373-1 is coupled to sense line 305-1 and a first source/drain region of transistor 373-2 is coupled to sense line 305-2, a first source/drain region of transistor 375-1 is coupled to sense line 305-2 and a first source/drain region of transistor 375-2 is coupled to sense line 305-1, a first source/drain region of transistor 377-1 is coupled to sense line 305-1 and a first source/drain region of transistor 377-2 is coupled to sense line 305-2, and a first source/drain region of transistor 379-1 is coupled to sense line 305-2 and a first source/drain region of transistor 379-2 is coupled to sense line 305-1.

The selection logic circuitry 313 can be coupled to the compute component 331 and/or additional storage location(s) 321 via the first storage location lines 309-1 and 309-2 and/or the second storage location lines 310-1 and 310-2. The compute component 331 can be analogous to the compute component 631 illustrated in FIG. 6 and discussed in more detail herein. The first storage location lines 309-1 and 309-2 can be coupled to source drain regions of transistors other than the four pairs of transistors previously described. In some embodiments, the second storage location line 310-1 can couple node 364 of the compute component 331 (shown in detail as the compute component 631 in FIG. 6) to gates and source drain regions of transistors other than the four pairs of transistors previously described. The second storage location line 310-2 can couple node 366 of the compute component 331 (shown in detail as the compute component 631 in FIG. 6) to gates and source drain regions of transistors other than the four pairs of transistors previously described.

In some embodiments, a first storage location 333 and a second storage location 335 may be included in the compute component 331. The first storage location 333 may be coupled to a first pair of transistors 347-1/347-2 and/or a second pair of transistors 341-1/341-2. In some embodiments, the first pair of transistors 347-1/347-2 that are coupled to the first storage location 333 may be coupled to a SHIFT 1 control signal line 334-1 (e.g., a signal line to carry a shift right phase 2, left phase 1 control signal), as described in more detail in connection with FIG. 6, herein. The second pair of transistors 341-1/341-2 may be coupled to a first column repair (e.g., ColRepB) signal line 332-1.

In some embodiments, the second storage location 335 may be coupled to a third pair of transistors 347-3/347-4 and/or a fourth pair of transistors 341-3/341-4. The third pair of transistors 347-3/347-4 coupled to the second storage location 335 may be coupled to a SHIFT 2 control signal line 334-2 (e.g., a signal line to carry a shift right phase 1, left phase 2 control signal), as described in more detail in connection with FIG. 6, herein. The fourth pair of transistors 341-3/341-4 may be coupled to a second column repair (e.g., ColRepB) signal line 332-2.

If a first storage location 333 is the destination of the logical operation, the original state of the first storage location may be held dynamically by capacitance when the SHIFT 1 control signal line 334-1 (e.g., SHIFT 1 control signal line 681 illustrated in FIG. 6) and the SHIFT 2 control signal line 334-2 (e.g., SHIFT 1 control signal line 682 illustrated in FIG. 6) are disabled. This may allow for a possible new state to be written from selection logic circuitry 313, for example via first storage location signal lines 309-1 and 309-2.

In some embodiments, depending on the logical operation and the state of the sense amplifier operand, the first storage location signal lines 309-1 and 309-2 may not be driven from the selection logic circuitry 313 such that the original value of the first storage location 333 may be preserved when the SHIFT 1 control signal line 334-1 and the SHIFT 2 control signal line 334-2 are enabled as part of the logical operation. This may allow for a signal on nodes 364 and 366 to be held by dynamic capacitance, for example.

In some embodiments, the selection logic circuitry 313 and/or the compute component 331 can include logic circuitry storage location 332. Logic circuitry storage location 332 may be configured to actively store (e.g., latch) a data value received thereto. For example, logic circuitry storage location 332 can comprise a latch that can be configured to receive a data value from the first storage location 333, and may actively store the data value. In some embodiments, logic circuitry storage location 332 can store an indication of whether a logical operation is to be selectively performed between an operand stored in the sensing circuitry and an operand stored in the sense amplifier.

As illustrated in FIG. 3A, a column repair (ColRep) signal line 338 can be connected to a pair of ColRep transistors 336-1/336-2. In some embodiments, a signal may be provided on ColRep signal line 338 to provide a column repair signal that may be used to provide a repair capability by blocking signals carried on the first storage location lines 309-1 and 309-2 and/or the second storage location lines 310-1 and 310-2. For example, a signal may be provided on ColRep signal line 338 to block signals carried on the first storage location lines 309-1 and 309-2 and/or the second storage location lines 310-1 and 310-2 to remove (e.g., short) sense amplifier 306 and/or compute component 331 such that sense amplifier 306 and/or compute component 331 are effectively removed from a particular sensing component. For example, a ColRep signal line 338 may be coupled to a fuse or fuse latch (not illustrated). A data value may be shifted from one sensing circuitry to a neighboring sensing circuitry when the fuse in not blown and/or is functional. In some examples, a data value may be shifted from a first sensing circuitry to a third sensing circuitry through a second sensing circuitry between the first and the third sensing circuitries. In this way, a sensing circuitry can be referred to as "column repaired" and avoid using a defective sensing circuitry, indicated by the blown fuse. In some examples, a fuse can be blown in response to a defective sense amplifier of a sensing component. In some examples, a fuse can be functional and not blown, indicting a functional sense amplifier of a sensing component.

In some embodiments, ColRep transistors 336-1/336-2 may be asserted (e.g., driven high) when the second pair of transistors 341-1/341-2 and/or fourth pair of transistors 341-3/341-4 are driven low. This may allow for a path to be provided through sense amp 306. For example, when the second pair of transistors 341-1/341-2 and/or fourth pair of transistors 341-3/341-4 are driven low, a shift path which may be used in normal operation may be blocked such that a data signal is passed through the ColRep transistors 336-1/336-2, effectively providing a "short through" path through sense amp 306 and/or compute component 331.

In some embodiments, ColRep signal line 338 is connected to physically adjacent storage locations (e.g., storage locations 333 and 335 that are connected to a same shared input/output (SIO) signal line (not shown). The SIO signal line may be connected to the physically adjacent storage locations 333/335 via a multiplexer that may be configured to multiplex column select signals to the SIO. In some embodiments, signals may be provided to the ColRep signal line 338 during shifting operations, but may not be utilized while logical operations are performed.

In some embodiments, ColRep signal line 338 may be multiplexed to a plurality of compute components 331 such that a signal on ColRep signal line 338 is sent to a plurality of storage locations associated with a plurality of compute components 331. For example, ColRep signal may be multiplexed to eight compute components 331. In some embodiments, ColRep signal can provide the indication of whether a logical operation is to be selectively performed to a portion of a row of memory array (e.g., about 2K bits per ColRep signal).

While FIG. 3A is an example of a portion of memory including column repair circuitry, examples are not so limited. For example, FIG. 3B is an alternate example of a portion of a memory array including compute component 331 comprising selection logic circuitry 313 and additional storage location(s) 321 in accordance with a number of embodiments of the present disclosure. As shown in FIG. 3B, the architecture is modified for the compute component 331 but is the same for the selection logic circuitry 313.

In the example illustrated in FIG. 3B, a column repair (COLREP) signal line 338 is coupled to a first pair of column repair transistors 336-1 and 336-2 and a second pair of column repair transistors 337-1 and 337-2. The second pair of column repair transistors 337-1 and 337-2 can be also coupled to a ground. A first source/drain region of transistor 337-1 is coupled to a first source/drain region of transistor 341-1. A second source/drain region of transistor 341-1 is coupled to SHIFT control signal line (SHIFT 1) 334-1. A first source/drain region of transistor 337-2 is coupled to a first source/drain region of transistor 341-2. A second source/drain region of transistor 341-2 is coupled to SHIFT control signal line (SHIFT 2) 334-2. In this way, as similarly described in FIG. 3A, FIG. 3B illustrates that ColRep transistors 336-1/336-2 may be asserted (e.g., driven high) when the pair of transistors 341-1/341-2 are driven low. This may allow for a path to be provided through sense amp 306. For example, when the pair of transistors 341-1/341-2 are driven low, a shift path used in normal operation may be blocked such that a data signal is passed through the ColRep transistors 336-1/336-2, effectively providing a "short through" path through sense amp 306 and/or compute component 331.

FIGS. 4A-4B are each a schematic diagram illustrating a portion of a memory array including sensing components in accordance with a number of embodiments of the present disclosure. FIG. 4A is an example of sensing components 450-1, 450-2, 450-3, . . . , 450-Z. A sensing component 450-1 can include a sense amplifier 406-1 (e.g., sense amplifier 206 in FIGS. 2 and 306 in FIG. 3) and a compute component 431-1 (e.g., compute component 231 in FIGS. 2 and 331 in FIG. 3). While four sensing components are illustrated, examples are not so limited. For example, a row of nine sensing components can be used wherein eight sensing components are used for storing and/or shifting data with a ninth being a redundant sensing component that is not used unless at least one of the eight sensing components is defective (e.g., includes a defective sense amplifier). Shifting data from a first sensing component 450-1 to a neighboring second sensing component 450-2 can be useful in performing a number of operations using the sensing circuitry. For example, locations of the sensing circuitry in relation to each other can be particularly important when performing a multiplication and/or division operation to shift data values amongst the sensing components in a particular order and/or arrangement.

Data can be shifted from being stored in a first sense amplifier 406-1 (data indicated as stored as "A" in sensing component 450-1 in FIG. 4A) of a first sensing component 450-1 to being stored in a second sense amplifier 406-2 of a second sensing component 450-2. Data can be shifted from the second sense amplifier 406-2 (data indicated as "B" stored in sensing component 450-2 in FIG. 4A) to a third sense amplifier 406-3 of a third sensing component 450-3, and so forth. For example, data "A" would shift to be located where "B" is, data "B" would shift to be stored where "C" is, and so forth, with the location marked as "Z" storing no data from the shifting. In response to the sense amplifiers all being functional, the "Zth" sense amplifier 406-Z would not receive shifted data from previous sensing components. However, in response to a sense amplifier becoming defective, a fuse associated with the sense amplifier could be blown and, as illustrated in FIG. 4B, the Zth sense amplifier could be used to shift data.

FIG. 4B is an example of sensing components 450-1, 450-2, 450-3, . . . , 450-Z. As illustrated in FIG. 4B, a first sensing component 450-1 and a third sensing component 450-3 can each include a functional sense amplifier and a second sensing component 450-2 can include a defective sense amplifier 406-2, as illustrated by an "X" over the second sensing component 450-2. In this example, data "A" stored in the first sensing component 450-1 would be shifted through the second sensing component 450-2 (using column repair signals described in association with FIG. 3A or FIG. 3B) to be stored in the third sensing component 450-3. Data stored in the second sensing component 450-2 would be prevented from being transferred out of the sense amplifier 406-2, as described in association with FIG. 3A. Data "B" stored in the third sensing component 450-3 would be shifted to be stored in the Zth sensing component 450-Z.

FIGS. 5A-5B are each a schematic diagram illustrating a portion of a memory array including sensing components in accordance with a number of embodiments of the present disclosure. FIG. 5A is an example of sensing components 550-Y, . . . , 550-1, 550-2, 550-3, 550-4, 550-5, 550-6, . . . , 550-Z. A sensing component 550-1 can include a sense amplifier 506-1 (e.g., sense amplifier 206 in FIGS. 2 and 306 in FIG. 3) and a compute component 531-1 (e.g., compute component 231 in FIGS. 2 and 331 in FIG. 3). A first redundant, or Yth, sensing component 550-Y can be used for shifting data from a first direction and a second redundant, or Zth, sensing component 550-Z can be used for shifting data from a second direction. In this way, more than one defective sense amplifier can be compensated for. While eight sensing components are illustrated, examples are not so limited. For example, a row of ten sensing components can be used wherein eight sensing components (e.g., 550-1 to 550-8) are used for storing and/or shifting data with a ninth being a first redundant sensing component (e.g., 550-Y) for shifting data from an additional sensing component from a first direction and a tenth being a second redundant sensing component (e.g., 550-Z) for shifting direction from a second direction.

As illustrated in FIG. 5A, the first redundant sensing component 550-Y and the second redundant sensing component 550-Z can be unused in response to all of the sensing components 550-1 to 550-6 including a functional sense amplifier 506-1 to 506-6. In this example, data "A" stored in the first sensing component 550-1 can be shifted to a second sensing component 550-2. Data "B" stored in the second sensing component 550-2 can be shifted to a third sensing component 550-3, and so forth, until data is shifted to a final sensing component in a row, e.g., illustrated as "E" shifted from being stored in a fifth sensing component 550-5 to being stored in a sixth sensing component 550-6. Data "F" could be shifted either around to the first sensing component 550-1 and/or shifted to an additional sensing component not illustrated.

However, in response to the second sensing component 550-2 and the fifth sensing component 550-5 including a defective sense amplifier, 506-2 and 506-5, the first and second redundant sensing components 550-Y and 550-Z can be used, as illustrated in FIG. 5B. For example, in the example of FIG. 5B, the second sensing component 550-2 and the fifth sensing component 550-5 includes a defective sense amplifier, 506-2 and 506-5, respectively, as indicated by the "X" over the sensing components.

Data "A" is now shifted from being stored in the first redundant sensing component 550-Y to being stored in the first sensing component 550-1. Data "B" is now shifted, through the second sensing component 550-2, from being stored in the first sensing component 550-1 to being stored in the third sensing component 550-3. The data is able to shift through the second sensing component 550-2 without being stored in the second sense amplifier 506-2 using the column repair signal lines and associated transistors, as illustrated in FIG. 3A. Likewise, data "D is shifted, through the fifth sensing component 550-5, from being stored in the fourth sensing component 550-4 to being stored in the sixth sensing component. Data "E" is shifted from being stored in the sixth sensing component 550-6 to being stored in the second redundant sensing component 550-Z.

While data is described as being shifted a single position, e.g., from the first redundant sensing component 550-Y to the first sensing component 550-1, examples are not so limited. For example, data "A" stored in the first redundant sensing component 550-Y can be shifted two positions to the right and would therefore be stored in the third sensing component 550-3. In addition, shifting is not limited to a right-ward direction, as illustrated. Data can be shifted towards the first redundant sensing component 550-Y or towards the second redundant sensing component 500-Z.

Figure 6:
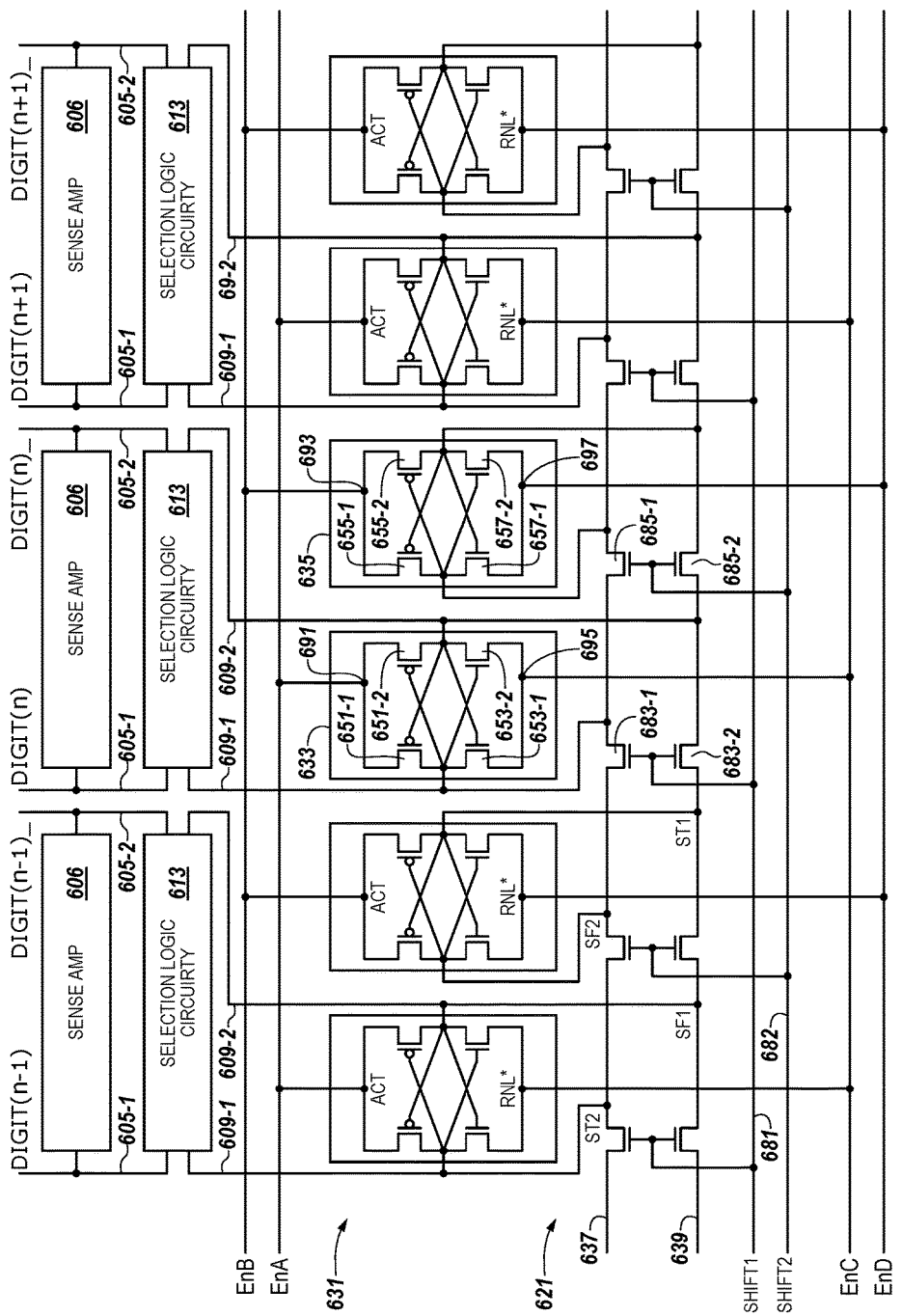
FIG. 6 is a schematic diagram illustrating sensing circuitry in accordance with a number of embodiments of the present disclosure.

FIG. 6 is a schematic diagram illustrating sensing circuitry in accordance with a number of embodiments of the present disclosure. FIG. 6 shows a number of sense amplifiers 606 coupled to respective pairs of complementary sense lines 605-1 and 605-2, and a corresponding number of compute components 631 coupled to the sense amplifiers 606. The sense amplifiers 606 and compute components 631 shown in FIG. 6 can correspond to sensing circuitry 150 shown in FIG. 1, for example. The sensing circuitry shown in FIG. 6 includes selection logic circuitry 613, which can be operated as described further herein. The selection logic circuitry 613 shown in FIG. 6 can correspond to selection logic circuitry 213 shown in FIG. 2 or selection logic circuitry 313 shown in FIGS. 3A and 3B, for example.

Although not shown, memory cells, such as those described in FIG. 2, are coupled to the pairs of complementary sense lines 605-1 and 605-2 The cells of the memory array can be arranged in rows coupled by word lines and columns coupled by pairs of complementary sense lines DIGIT(n−1)/DIGIT(n−1)_, DIGIT(n)/DIGIT(n)_, DIGIT(n+1)/DIGIT(n+1)_, etc. The individual sense lines corresponding to each pair of complementary sense lines can also be referred to as data lines. Although only three pairs of complementary sense lines (e.g., three columns) are shown in FIG. 6, embodiments of the present disclosure are not so limited.

As shown in FIG. 6, the sensing components can comprise a sense amplifier 606 and a compute component 631, which comprises selection logic circuitry 613 and compute component storage locations/shift logic circuitry 621 corresponding to respective columns of memory cells (e.g., coupled to respective pairs of complementary sense lines). The compute component 631 may include storage location 632. Although storage location 632 is illustrated as part of the selection logic circuitry 613, embodiments are not so limited, and storage location 632 can be located at other locations within the compute component 631. Storage location 632 may be a cross-coupled latch, D latch, or other circuit configuration capable of storing an operand (e.g., a data value). The sense amplifier 606 can comprise, for example, a cross coupled latch, which can be referred to herein as a primary latch. The sense amplifiers 606 can be configured, for example, as described with respect to FIG. 2.

A data value present on the pair of complementary sense lines 605-1 and 605-2 can be loaded into the corresponding compute component 631. In some embodiments, the compute component storage locations/shift logic circuitry 621 can include a pair of compute component storage locations (e.g., first compute component storage location 633 and second compute component storage location 635) associated with each compute component 631. In some embodiments, the first compute component storage location 633 and the second compute component storage location 635 can comprise stages of a shift register. For example, in at least one embodiment, the compute component storage locations (e.g., first compute component storage location 633 and second compute component storage location 635) can serve as respective stages of a shift register capable of shifting data values (e.g., right and/or left) and/or performing rotation operations (e.g., rotate right and/or rotate left). As an example, the data values can be loaded into the compute component storage locations of a corresponding compute component 631 by overwriting of the data values currently stored in the compute component storage locations of the corresponding compute components 631 with a data value stored in the corresponding sense amplifier 606. The data value on the pair of complementary sense lines 605-1 and 605-2 can be the data value stored in the sense amplifier 606 when the sense amplifier is enabled (e.g., fired).

In some embodiments, a first latching/activation signal ACT is applied to the two p-channel transistors 651-1 and 651-2 of the first compute component storage location 633 and a second latching/activation signal RNL* is applied to the two n-channel transistors 653-1 and 653-2 of the second compute component storage location 635. Similarly, a second ACT signal is applied to the two p-channel transistors 655-1 and 655-2 of the second compute component storage location 635 and a second RNL* signal is applied to the two n-channel transistors 657-1 and 657-2 of the second compute component storage location 635. In some embodiments, the respective ACT and RNL* signals control operation of the first compute component storage location 633 and the second compute component storage location 635. As shown in FIG. 6, power to the first compute component storage location 633 and the second compute component storage location 635 can be provided via a pairs of complementary enable signals (e.g., EnA/EnC, and EnB/EnD, respectively). For example, first compute component storage location 633 is coupled to EnA at power node 691, and second compute component storage location is coupled to EnB at power node 693. First compute component storage location 633 is coupled to EnC at power node 695, and second compute component storage location 635 is coupled to EnD at power node 697. Although not shown in FIG. 6, a power supply transistor can be coupled to each of the enable signals EnA, EnB, EnC, and EnD and to a reference voltage (e.g., $V_{SS}$).

As shown in FIG. 6, signal input lines 637 and 639 are coupled to respective accumulator signal lines 609-1 and 609-2 at ST2 and SF1, respectively. In some embodiments, signal input lines 637 and 639 are coupled to respective storage location lines 610-1 and 610-2 at SF2 and ST1, respectively. In operation, the voltage on one of the signal input lines 637 or 639 will be slightly greater than the voltage on one of the other signal input lines 637 or 639. The signal input line 637 or 639 having the lower voltage will turn on one of the p-channel transistors 651-1 or 651-2 in the first secondary latch (e.g., first compute component storage location 633) to a greater extent than the other of p-channel transistors 651-1 or 651-2, thereby driving higher the first compute component storage location signal lines 609-1 or 609-2 having a higher voltage to a greater extent than the other first compute component storage location signal line 609-1 or 609-2 is driven high. Similarly, the signal input line 637 or 639 having the lower voltage will turn on one of the p-channel transistors 655-1 or 655-2 in the second secondary latch (e.g., second compute component storage location 635) to a greater extent than the other of transistors 655-1 or 655-2, thereby driving higher the first compute component storage location signal line 609-1 or 609-2 having a higher voltage to a greater extent than the other first compute component storage location signal line 609-1 or 609-2 is driven high.

The signal input line 637 or 639 having the higher voltage will turn on one of the n-channel transistors 653-1 or 653-2 in the first secondary latch to a greater extent than the other of the transistors 653-1 or 653-2, thereby driving lower the first s compute component storage location signal line 609-1 or 609-2 having the lower voltage to a greater extent than the other first compute component storage location signal line 609-1 or 609-2 is driven low. Similarly, the signal input line 637 or 639 having the higher voltage will turn on one of the n-channel transistors 657-1 or 657-2 in the second secondary latch to a greater extent than the other of the transistors 657-1 or 657-2, thereby driving lower the first compute component storage location signal line 609-1 or 609-2 having the lower voltage to a greater extent than the other first compute component storage location signal line 609-1 or 609-2 is driven low. Accordingly, as used herein, a "high side" or "high node," and a "low side" or "low node" of the first compute component storage location 633 and/or the second compute component storage location 635 refer to a side of the storage location on which a differential voltage is comparatively high or comparatively low, respectively.

The first and second sampling transistors 683-1 and 683-2 can be controlled by a shift signal. For example, an input of first compute component storage location 633 can be coupled to the first and second sampling transistors 683-1 and 683-2, and an input of second compute component storage location 635 can be coupled to the third and fourth sampling transistors 685-1 and 685-2. In some embodiments, the first and second sampling transistors 683-1 and 683-2 and/or the third and fourth sampling transistors 685-1 and 685-2 can control storing and/or shifting of data values between the first compute component storage location 633 and the second compute component storage location 635.

In some embodiments, the first and second sampling transistors 683-1 and 683-2 and/or the third and fourth sampling transistors 685-1 and 685-2 may be enabled or disabled in response to a control signal. For example, the first and second sampling transistors 683-1 and 683-2 may be enabled or disabled in response to a SHIFT 1 control signal line 681, and the third and fourth sampling transistors 685-1 and 685-2 may be enabled or disabled in response to a SHIFT 2 control signal line 682, as described in more detail, herein. The SHIFT 1 control signal line 681 can carry a shift right phase 2, left phase 1 control signal, and the SHIFT 2 control signal line 682 can carry a shift right phase 1, left phase 2 control signal.

In some embodiments, transferring a data value from the first compute component storage location 633 to the second compute component storage location 635 is carried out by controlling which of power nodes 691, 693, 695, and 697 are providing a voltage to each of the first compute component storage location 633 and the second compute component storage location 635 over time. For example, transferring a data value from the first compute component storage location 633 to the second compute component storage location 635 can include applying a voltage to first compute component storage location at power nodes 691 and/or 695 when a voltage is not applied to second storage location 635 at power nodes 693 and/or 697, and synchronously switching the applied voltages such that the voltage is no longer applied to first compute component storage location 633 at power nodes 691 and/or 695 and the voltage is instead applied to second compute component storage location 635 at power nodes 693 and/or 697. In some embodiments, the first and second sampling transistors 683-1 and 683-2 and/or the third and fourth sampling transistors 685-1 and 685-2 may be enabled when the voltage is switched from power node 691 and/or 695 to power node 693 and/or 697, or vice versa. In some embodiments, the first compute component storage location 633 and/or the second compute component storage location 635 are equalized when their respective power node 691/695 or 693/697 is not receiving a voltage signal.

If a first compute component storage location 633 is the destination of a logical operation, the original state of the first compute component storage location may be held dynamically by capacitance when the SHIFT 1 control signal line 681 and the SHIFT 2 control signal line 682 are disabled. This may allow for a possible new data value to be written from selection logic circuitry 613, for example via first compute component storage location signal lines 609-1 and 609-2.

The first compute component storage location 633 and the second compute component storage location 635 can each operate in several stages. A first stage of operation can include an equalization stage in preparation for receiving a differential input signal. In some embodiments, the differential input signal can be received from signal input lines 637 and/or 639. A second stage of operation can include a sample stage in which the differential input signal is received by the first compute component storage location 633 and/or the second compute component storage location 635. For example, a data value can be received and/or stored by the first compute component storage location 633 and/or the second compute component storage location 635 based on the differential input signal on compute component signal lines 609-1 and 609-2. A third stage of operation can include an "amplify and latch" stage where the received differential input signal is amplified and latched by the first compute component storage location 633 and/or the second compute component storage location 635.

In some embodiments, the third stage can be facilitated by cross coupled transistors 653-1 and 653-2, and 651-1 and 651-2 associated with the first compute component storage location 633, which can amplify the differential voltage on signal input lines 637 and 639 and operate to latch a data value received at the first compute component storage location 633. Similarly, coupled transistors 657-1 and 657-2, and 655-1 and 655-2 associated with the second compute component storage location 635, can amplify the differential voltage on signal input lines 637 and 639 and operate to latch a data value received at the second compute component storage location 635. In some embodiments, the third stage can include driving the data value from one compute component storage location to a next compute component storage location (e.g., driving the data value from the first compute component storage location 633 to the second compute component storage location 635).

Although not shown in FIG. 6, each column of memory cells can be coupled to a column decode line that can be activated to transfer, via a local I/O line, data values from corresponding sense amplifiers 606 and/or compute components 631 to a control component external to the array such as an external processing resource (e.g., host processor and/or other functional unit circuitry). The column decode line can be coupled to a column decoder. However, as described herein, in a number of embodiments, data need not be transferred via such I/O lines to perform shift operations in accordance with embodiments of the present disclosure. In a number of embodiments, sense amplifiers 606 and compute components 631 may be operated to perform logical operations without transferring data to a control component external to the array, for instance. As used herein, transferring data, which may also be referred to as moving data or shifting data is an inclusive term that can include, for example, copying data from a source location to a destination location and/or moving data from a source location to a destination location without necessarily maintaining a copy of the data at the source location.

Embodiments of the present disclosure are not limited to the logical operation performance capability described in association with the compute components 631. For example, a number of embodiments can include circuitry in addition to and/or instead of the circuitry described in association with the compute component 631.

FIG. 7A is a logic table illustrating selectable logical operation results implemented by sensing circuitry in accordance with a number of embodiments of the present disclosure. FIG. 7A shows a resultant data value that is initially stored in the first compute component storage location (e.g., first compute component storage location 633 shown in FIG. 6) after the sense amplifier (e.g., sense amplifier 606 shown in FIG. 6 is enabled (e.g., fired). Starting data values (e.g., operands) for a particular logical operation can be stored in the sense amplifier and/or the first compute component storage location from the memory array. For the purpose of describing FIGS. 7A and 7B, a first operand (e.g., "A") is a data value that can be read from a memory array and stored in the first compute component storage location and a second operand (e.g., "B"), is a data value that can be read from the memory array by the sense amplifier. As described further below in association with FIG. 9, a number of embodiments can include reading operand A into a sense amplifier (e.g., 606), transferring operand A from the sense amplifier to a first compute component storage location (e.g., 633), transferring operand A from the first compute component storage location to a second compute component storage location (e.g., 632), and then operating the sensing circuitry to perform a selected logical operation between operand A and an operand B by activating the appropriate corresponding selection logic signals (e.g., BOOL0, BOOL1, BOOL2, and BOOL3) at the appropriate time (e.g., either before or after enabling the sense amplifier to sense operand B from a selected memory cell).

A selected logical operation between the first data value and a second data value can be performed based on the appropriate control signals corresponding to the selected logical operation being provided to the logic circuitry (e.g., selection logic circuitry 213 shown in FIG. 2, selections logic circuitry 313 shown in FIG. 3A, selection logic circuitry 413 shown in FIG. 4, etc.). For instance, in FIG. 7A, "RESULT IN FIRST STORAGE LOCATION—(AFTER SENSE AMP FIRE)" indicates that the control signals corresponding to the selected logical operation are enabled after the sense amplifier is enabled, such that the result of the selected logical operation is initially stored in the first compute component storage location. Similarly, in FIG. 7B, "RESULT IN SENSE AMP—(BEFORE SENSE AMP FIRE)" indicates that the control signals corresponding to the selected logical operation are enabled before the sense amplifier is enabled, such that the result of the selected logical operation is initially stored in the sense amplifier.

The logic table illustrated in FIG. 7A shows the starting data value stored in the first compute component storage location in column A at 770, and shows the starting data value stored in the sense amplifier in column B at 772. The various combinations of the control signals BOOL0, BOOL1, BOOL2, and BOOL3 are shown in FIG. 7A in the column headings in row 774. For example, the column heading of "0110" indicates that the results in that column correspond to control signal BOOL3 being a "0," control signal BOOL2 being a "1," control signal BOOL1 being a "1," and control signal BOOL0 being a "0."

The results for each combination of starting data values in the first compute component storage location ("A") and in the sense amplifier ("B") can be summarized by the logical operation shown for each column in row 776. For example, the result for the values of BOOL3, BOOL2, BOOL1, and BOOL0 of "0000" are summarized as "A" since the result (initially stored in the first storage location after the sense amplifier fires) is the same as the starting value in the first compute component storage location. Other columns of results are similarly annotated in row 776, where "A*B" intends A AND B, "A+B" intends A OR B, and "AXB" intends A XOR B. By convention, a bar over a data value or a logical operation indicates an inverted value of the quantity shown under the bar. For example, AXB bar intends NOT A XOR B, which is also A XNOR B.

FIG. 7B is another logic table illustrating selectable logical operation results implemented by sensing circuitry in accordance with a number of embodiments of the present disclosure. FIG. 7B shows a resultant data value that is initially stored in the sense amplifier (e.g., sense amplifier 606 shown in FIG. 6) after the sense amplifier is enabled corresponding to the various combinations of control signals BOOL3, BOOL2, BOOL1, and BOOL0. The logic table illustrated is arranged similar to that described with respect to FIG. 7A, with the starting data value stored in the first compute component storage location shown in column A at 770, and the starting data value stored in the sense amplifier shown in column B at 772. The various combinations of the control signals BOOL0, BOOL1, BOOL2, and BOOL3 is shown in FIG. 7B in the column headings shown in row 774, and the logical operation represented by each respective column of results shown in the column subheading at row 776.

In contrast with the logical operations summarized in the logic table illustrated in FIG. 7A, which reflects a logical operation result initially stored in the first compute component storage location after the sense amplifier is enabled, the logical operations summarized in the logic table illustrated in FIG. 7B reflects a logical operation result initially stored in the sense amplifier 606 after the sense amplifier is enabled (e.g., with the control signals corresponding to the selected logical operation being provided to the selection logic circuitry 213, 313, 413, 513, 613 before the sense amplifier is enabled). The logical operations summarized in the logic table illustrated in FIG. 7B include several different logical operations from those shown in the logic table illustrated in FIG. 7A including "B" (the logical operation result initially stored in the sense amplifier after the sense amplifier is enabled is the same as the starting data value in the sense amplifier), "RESET" (the logical operation result initially stored in the sense amplifier after the sense amplifier is enabled is always set to "0"), and "SET" (the logical operation result initially stored in the sense amplifier after the sense amplifier is enabled is always set to "1").

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   sensing circuitry comprising a first sensing component, a second sensing component, and a third sensing component, wherein the second sensing component includes a defective sense amplifier that is column repaired; and
   a controller configured to use the sensing circuitry to:
      shift data from the first sensing component to the third sensing component by transferring the data through the second sensing component, wherein the second sensing component is physically located between the first sensing component and the third sensing component.

2. The apparatus of claim 1, wherein the controller is configured to prevent the second sensing component from transferring data stored in the sense amplifier of the second sensing component.

3. The apparatus of claim 1, comprising an additional sensing component that is controlled by the controller to replace the defective sensing component in association with shifting data.

4. The apparatus of claim 3, wherein the controller is configured to, in response to none of the plurality of sensing components being defective, not use the additional sensing component.

5. The apparatus of claim 1, comprising a plurality of column repair circuitries associated with respective sensing components of the sensing circuitry.

6. The apparatus of claim 1, comprising a column repair circuitry associated with the second sensing component, wherein the column repair circuitry comprises a set of shift transistors and a set of alternate shift transistors.

7. The apparatus of claim 6, wherein the set of shift transistors are configured to, in response to the second sensing component including the defective sense amplifier, be deactivated and prevented from shifting data from the first sensing component to be stored as data in the second sensing component.

8. The apparatus of claim 7, wherein the set of alternate shift transistors are configured to be used to, in response to the second sensing component including the defective sense amplifier, perform the shift of the data from the first sensing component to the third sensing component.

9. The apparatus of claim 1, comprising a fourth sensing component that is configured to be a redundant sensing component.

10. The apparatus of claim 9, wherein, in response to the second sensing component including the defective sense amplifier, the sensing circuitry is configured to:
    store data previously associated with the second sensing component in the third sensing component; and
    stored data previously associated with the third sensing component in the redundant sensing component.

11. The apparatus of claim 10, wherein the third sensing component is physically between the second sensing component and the redundant sensing component.

12. A method comprising:
    in response to a second sensing component physically between a first sensing component and a third sensing component including a sense amplifier that is functional, shifting data stored in the first sensing component to the second sensing component; and
    in response to the second sensing component with the sense amplifier being defective, shifting data stored in the first sensing component to the third sensing component.

13. The method of claim 12, comprising, in response to the sense amplifier being defective, shifting data from the third sensing component to an additional sensing component.

14. The method of claim 13, wherein, in response to the sense amplifier being functional, not shifting data from the third sensing component to the additional sensing component.

15. The method of claim 12, comprising shifting the data from the first sensing component to the second sensing component through a set of shift transistors, wherein the second sensing component comprises the set of shift transistors.

16. The method of claim 12, comprising shifting the data from the first sensing component to the third sensing component through a set of alternate shift transistors, wherein the second sensing component comprises the alternate shift transistors.

17. An apparatus, comprising:
    sensing circuitry comprising a plurality of sensing components, wherein a second of the plurality of sensing components, physically between a first of the plurality of sensing components and a third of the plurality of sensing components, includes a defective sense amplifier that is column repaired; and
    a controller configured to use the sensing circuitry to:
       shift data from the first sensing component to the third sensing component by transferring the data through the second sensing component;
       prevent the second sensing component from transferring data from the defective sense amplifier of the second sensing component; and
       in response to the sense amplifier of the second sensing component being defective, shifting data to a redundant sensing component.

18. The apparatus of claim 17, wherein the controller is configured to drive a first signal associated with a first pair of signal lines low while driving a second signal associated with a second pair of signal lines high as part of an operation to cause a data value to be shifted from the first respective sense amplifier to the second respective sense amplifier in response to the sense amplifier of the second sensing component not being defective.

19. The apparatus of claim 17, wherein the second sensing component comprises a pair of column repair signal lines and the controller is configured to send a column repair signal on the pair of column repair signal lines to block signals carried from the defective sense amplifier.

20. The apparatus of claim 18, wherein the second sensing component comprises a second set of column repair signal lines and the controller is configured to send a complementary column repair signal line that is complementary to the column repair signal.

21. The apparatus of claim 17, wherein the second sensing component comprises a first set of column repair transistors that are controllable by the controller to be asserted high and a second set of column repair transistors that are controllable by the controller to be asserted low to allow a path for the data to be shifted through the second sensing component.

22. A method, comprising:
in response to a second sensing component physically between a first sensing component and a third sensing component including a sense amplifier that is functional:
    shifting data stored in the first sensing component to the second sensing component and shifting data stored in the second sending component to the third sensing component; and
    not shifting data to a redundant sensing component; and
in response to the second sensing component including a sense amplifier that is defective:
    shifting data stored in the first sensing component to the third sensing component; and
    shifting data from the third sensing component to an additional sensing component.

23. The method of claim 22, wherein the data shifted from the first sensing component to the third sensing component is shifted through the second sensing component.

24. The method of claim 23, wherein the data is shifted through the second sensing component without being stored in the second sensing component.

25. The method of claim 23, wherein data stored in the defective sense amplifier of the second sensing component is prevent from being shifted to another sensing component.

* * * * *